(12) United States Patent
Fujita et al.

(10) Patent No.: US 12,724,081 B2
(45) Date of Patent: Sep. 1, 2026

(54) DIAGNOSIS METHOD AND DIAGNOSIS APPARATUS OF POWER STORAGE SYSTEM, POWER STORAGE SYSTEM, AND NON-TRANSITORY STORAGE MEDIUM

(71) Applicant: KABUSHIKI KAISHA TOSHIBA, Tokyo (JP)

(72) Inventors: Yumi Fujita, Tokyo (JP); Tomokazu Morita, Funabashi Chiba (JP); Nobukatsu Sugiyama, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 319 days.

(21) Appl. No.: 18/240,682

(22) Filed: Aug. 31, 2023

(65) Prior Publication Data

US 2024/0230782 A1 Jul. 11, 2024

(30) Foreign Application Priority Data

Jan. 5, 2023 (JP) ................................ 2023-000586

(51) Int. Cl.
*G01R 31/392* (2019.01)
*G01R 31/374* (2019.01)
(Continued)

(52) U.S. Cl.
CPC ......... *G01R 31/392* (2019.01); *G01R 31/374* (2019.01); *G01R 31/385* (2019.01); *H02J 7/342* (2020.01)

(58) Field of Classification Search
CPC .. G01R 31/392; G01R 31/374; G01R 31/385; G01R 31/3835; G01R 31/36;
(Continued)

(56) References Cited

U.S. PATENT DOCUMENTS 10,938,075 B2 3/2021 Fujita et al.
11,201,486 B2 12/2021 Fujita et al.
(Continued)

FOREIGN PATENT DOCUMENTS

JP 2000036320 A 2/2000
JP 2011080966 A 4/2011
(Continued)

OTHER PUBLICATIONS

Office Action issued on Feb. 3, 2026, in corresponding Japanese Application No. 2023-000586, 9 pages.

*Primary Examiner* — Mohammad K Islam
(74) *Attorney, Agent, or Firm* — Maier & Maier, PLLC

(57) ABSTRACT

In an embodiment, in a diagnosis method of a power storage system, some of a plurality of power storage facilities are allocated as a facility to be measured, and at least some facilities other than the facility to be measured are allocated as an operation facility. Each facility to be measured is charged and discharged by exchanging electric power with another power storage facility, and measurement data of each facility to be measured is measured. The allocation of the facility to be measured and the operation facility and the measurement of the measurement data for each facility to be measured are repeated by sequentially changing the power storage facilities to be allocated as the facility to be measured until the measurement data is measured for all of the power storage facilities.

11 Claims, 6 Drawing Sheets

(51) Int. Cl.
*G01R 31/385* (2019.01)
*H02J 7/34* (2006.01)

(58) Field of Classification Search
CPC . G01R 31/396; H02J 7/342; H02J 3/32; H02J 7/0014; H02J 7/0047; H02J 7/0048; H02J 7/007182; Y02E 60/10; H01M 10/4257; H01M 10/48; H01M 10/60; H01M 10/625
See application file for complete search history.

(56) References Cited

U.S. PATENT DOCUMENTS

| | | | | |
|---|---|---|---|---|
| 11,243,261 | B2 | 2/2022 | Fujita et al. | |
| 11,486,931 | B2 | 11/2022 | Kiuchi et al. | |
| 2013/0207616 | A1* | 8/2013 | Shim | H02J 7/56 320/136 |
| 2016/0013670 | A1 | 1/2016 | Tohara et al. | |
| 2017/0033410 | A1 | 2/2017 | Tohara et al. | |
| 2018/0069270 | A1* | 3/2018 | Okabe | H02J 3/32 |
| 2018/0226811 | A1* | 8/2018 | Hanada | H02J 3/32 |
| 2018/0267108 | A1 | 9/2018 | Morita et al. | |
| 2020/0014238 | A1 | 1/2020 | Daniels | |
| 2020/0386820 | A1 | 12/2020 | Harper et al. | |
| 2021/0021000 | A1* | 1/2021 | Sada | G01R 31/389 |
| 2021/0135258 | A1* | 5/2021 | Oh | H01M 8/04619 |

FOREIGN PATENT DOCUMENTS

| | | | |
|---|---|---|---|
| JP | 2014164853 | A | 9/2014 |
| JP | 6104626 | B2 | 3/2017 |
| JP | 6157880 | B2 | 7/2017 |
| JP | 2017130417 | A | 7/2017 |
| JP | 2019057382 | A | 4/2019 |
| JP | 6567583 | B2 | 8/2019 |
| JP | 2020145816 | A | 9/2020 |
| JP | 2021035126 | A | 3/2021 |
| JP | 2021048663 | A | 3/2021 |
| JP | 2022526030 | A | 5/2022 |
| WO | 2015151652 | A1 | 10/2015 |

* cited by examiner

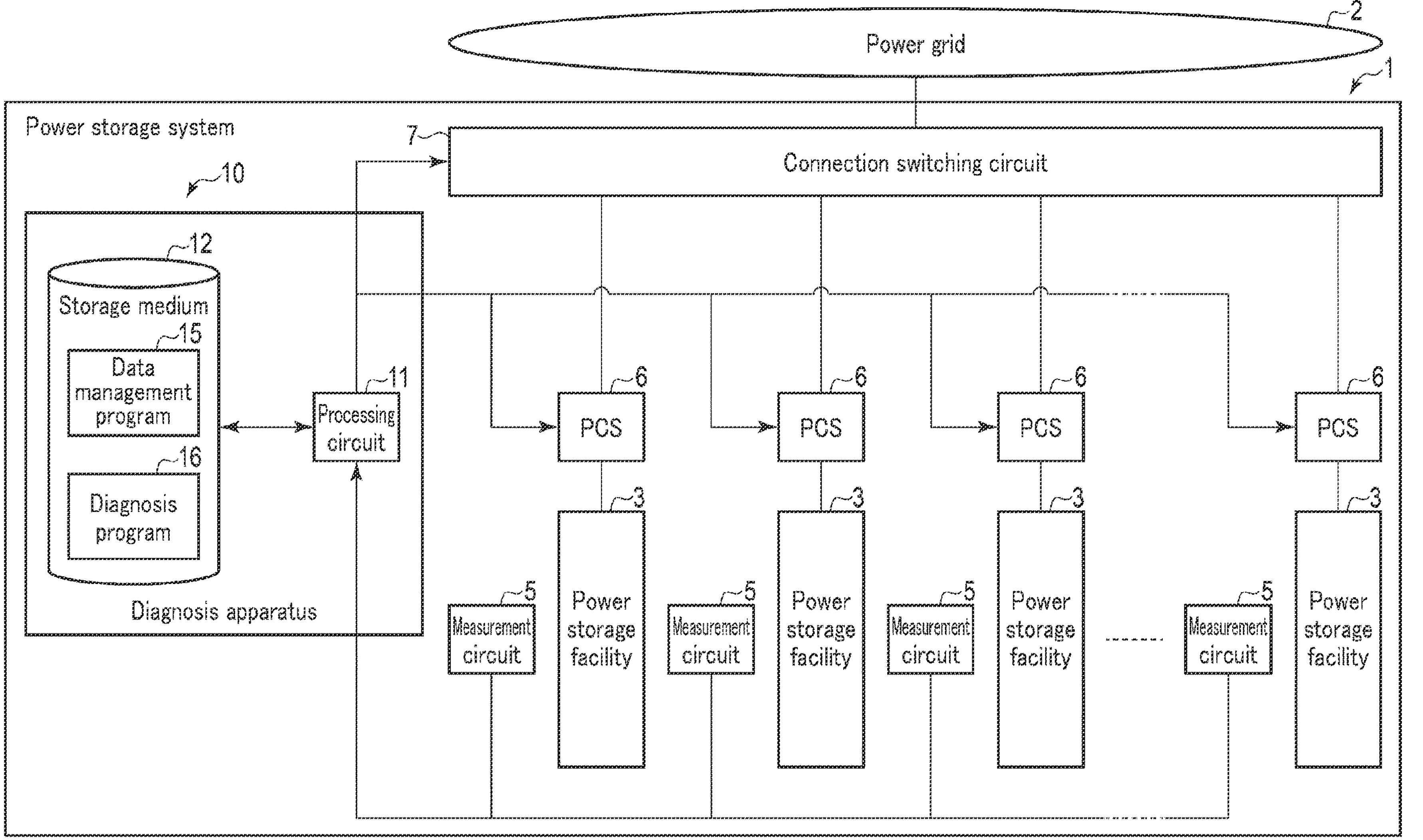
F I G. 1

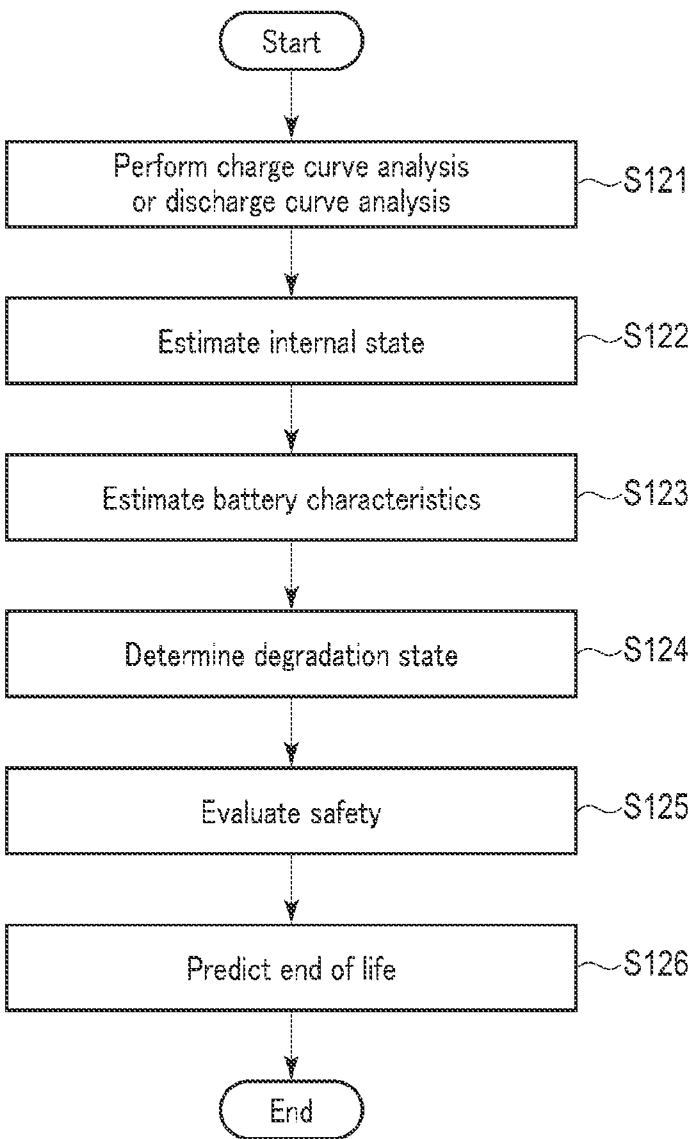
F I G. 5

DIAGNOSIS METHOD AND DIAGNOSIS APPARATUS OF POWER STORAGE SYSTEM, POWER STORAGE SYSTEM, AND NON-TRANSITORY STORAGE MEDIUM

CROSS-REFERENCE TO RELATED APPLICATION

This application is based upon and claims the benefit of priority from Japanese Patent Application No. 2023-000586, filed Jan. 5, 2023; the entire contents of which are incorporated herein by reference.

FIELD

Embodiments described herein relate generally to a diagnosis method and a diagnosis apparatus of a power storage system, the power storage system, and a non-transitory storage medium.

BACKGROUND

In a power storage station or the like, a power storage system including a plurality of power storage facilities is used. In a power storage system, each of a plurality of power storage facilities includes a plurality of battery modules electrically connected to each other, and the plurality of power storage facilities can exchange electric power independently relative to each other through a power grid. In the power storage system, each of the plurality of power storage facilities is operated by exchanging electric power with a power storage apparatus, a generator, a load apparatus, and the like outside the power storage system through a power grid.

In the power storage system as described above, diagnosis of a plurality of power storage facilities is periodically performed. In the diagnosis of the plurality of power storage facilities, for example, all the operations of the plurality of power storage facilities are stopped, and each of the power storage facilities is charged and discharged using an electric power source for diagnosis or the like. Then, measurement data for diagnosis is measured while each of the power storage facilities is charged or discharged under a predetermined condition. Then, for each of the power storage facilities, diagnosis is performed by, for example, estimating an internal state by analyzing measurement data for diagnosis.

As described above, in a power storage system including a plurality of power storage facilities, from the viewpoint of increasing revenue obtained by exchange of electric power through a power grid, and the like, it is required to enable appropriate diagnosis of all of the plurality of power storage facilities without simultaneously stopping operation of all of the plurality of power storage facilities. That is, it is required to enable appropriate diagnosis of all of the plurality of power storage facilities while continuing exchange of electric power through the power grid in at least some of the plurality of power storage facilities.

BRIEF DESCRIPTION OF DRAWINGS

FIG. 1 is a block diagram schematically showing an example of a power storage system according to an embodiment.

FIG. 5 is a flowchart schematically illustrating an example of processing in analysis of measurement data for diagnosis for one power storage facility performed by a processing circuit of the diagnosis apparatus in the embodiment.

DETAILED DESCRIPTION

Figure 2:
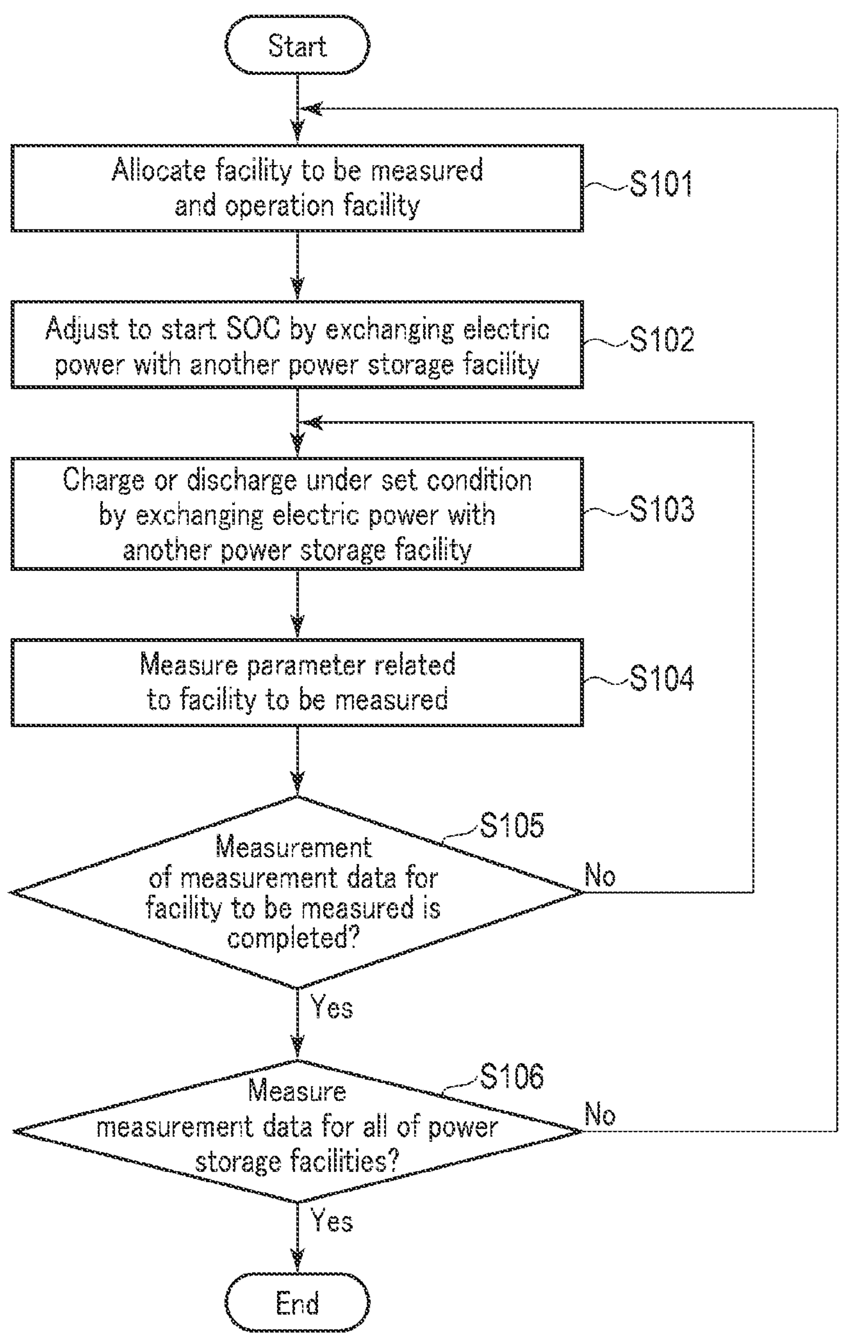
FIG. 2 is a flowchart schematically illustrating an example of processing performed by a processing circuit of a diagnosis apparatus in a case where measurement data for diagnosis is measured for each of a plurality of power storage facilities of the power storage system in the embodiment.

In an embodiment, in a diagnosis method of a power storage system including a plurality of power storage facilities, the method includes allocating some of the plurality of power storage facilities as a facility to be measured, and at least some facilities other than the facility to be measured as an operation facility that exchanges electric power through a power grid. In the diagnosis method, each facility as the facility to be measured is charged and discharged by exchanging electric power with another power storage facility of the power storage system, and measurement data for diagnosis of each facility as the facility to be measured is measured. In the diagnosis method, the allocation of the facility to be measured and the operation facility and the measurement of the measurement data for each facility as the facility to be measured are repeated by sequentially changing the power storage facilities to be allocated as the facility to be measured until the measurement data is measured for all of the plurality of power storage facilities.

Hereinafter, embodiments will be described with reference to the drawings.

FIG. 1 shows an example of a power storage system 1 according to an embodiment. The power storage system 1 is used in a power storage station or the like, and is, for example, a large-sized power storage system for a power grid. The power storage system 1 can be connected to a power grid 2, and can exchange electric power with an apparatus (not shown) outside the power storage system 1 through the power grid 2. Examples of the power grid 2 include a power grid that supplies electric power from a generator that generates electric power using natural energy such as sunlight and wind power, and a power grid that supplies electric power from a power plant. Examples of the apparatus that exchanges electric power with the power storage system 1 through the power grid 2 include a power storage apparatus, a generator, and a load apparatus. In an example, electric power from a generator that generates electric power using natural energy is stored in the power storage system 1 through the power grid 2. Then, the power storage system 1 supplies the stored electric power to an external power storage apparatus, a load apparatus, and the like through the power grid 2. As described above, revenue and the like can be obtained by the exchange of electric power in the power storage system 1 through the power grid 2. For example, the power storage system 1 can be monetized by using the power storage system 1 as a virtual power plant (VPP).

The power storage system 1 includes a plurality of power storage facilities 3. The plurality of power storage facilities 3 can transmit and receive electric power independently relative to each other through the power grid 2. That is, the plurality of power storage facilities 3 can be independently connected to the power grid 2. Each of the plurality of power storage facilities 3 includes a plurality of battery modules (not shown), and in each of the power storage facilities 3, the plurality of battery modules is electrically connected to each other. In each of the power storage facilities 3, a plurality of battery modules may be electrically connected in series, or a plurality of battery modules may be electrically connected in parallel. In each of the power storage facilities 3, both a structure in which a plurality of battery modules is electrically connected in series and a structure in which a plurality of battery modules is electrically connected in parallel may be formed. In each of the plurality of battery modules, a plurality of battery cells (unit cells) is electrically connected. In each of the battery modules, a plurality of battery cells may be electrically connected in series, or a plurality of battery cells may be electrically connected in parallel. In each of the battery modules, both a structure in which a plurality of battery cells is electrically connected in series and a structure in which a plurality of battery cells is electrically connected in parallel may be formed.

The power storage system 1 includes measurement circuits 5 the number of which is the same as the number of the power storage facilities 3 are provided, and one measurement circuit 5 is provided for each of the power storage facilities 3. Each of the measurement circuits 5 measures a parameter related to the corresponding one of the power storage facilities 3. For example, each of the measurement circuits 5 measures current and of the corresponding one of the power storage facilities 3. In addition, each of the measurement circuits 5 may measure temperature of the corresponding one of the power storage facilities 3. Therefore, each of the measurement circuits 5 may include an ammeter that measures current and a voltmeter that measures voltage, and may include a temperature sensor that measures temperature, and the like. Each of the measurement circuits 5 may measure any of the current, the voltage, and the temperature of each of the plurality of battery modules for the corresponding one of the power storage facilities 3.

The power storage system 1 includes power conditioning subsystems 6 (PCSs), as the bidirectional power converters, the number of which is the same as the number of the power storage facilities 3, and one PCS 6 is provided for each of the power storage facilities 3. Each of the PCSs 6 converts electric power from the power grid 2 and inputs the converted electric power to the corresponding one of the power storage facilities 3. At this time, each of the PCSs 6 converts, for example, AC electric power from the power grid 2 into DC electric power in a voltage range corresponding to the power storage facility 3 by AC/DC conversion and transformation, and inputs the converted DC electric power to the corresponding one of the power storage facilities 3. Each of the PCSs 6 converts electric power from the corresponding one of the power storage facilities 3 to output the converted electric power to the power grid 2. At this time, each of the PCSs 6 converts, for example, DC electric power from a corresponding one of the power storage facilities 3 into AC electric power in a voltage range and a frequency range corresponding to the power grid 2 by DC/AC conversion and transformation to output the converted AC electric power to the power grid 2.

In addition, the power storage system 1 includes a connection switching circuit 7. The connection switching circuit 7 is provided between each of the PCSs 6 and the power grid 2, and can switch an electrical connection state of each of the power storage facility 3 to the power grids 2. The connection switching circuit 7 can switch an electrical connection state with respect to the power grid 2 for each power storage facility 3. As a result, the plurality of power storage facilities 3 can exchange electric power independently relative to each other through the power grid 2. In addition, since the electrical connection state to the power grid can be switched for each power storage facility 3, in the power storage system 1, the connection switching circuit 7 can form a state in which one power storage facility 3 is electrically connected to the power grid 2 and another power storage facility 3 is not electrically connected to the power grid 2. In addition, the connection switching circuit 7 can switch an electrical connection state of each of the power storage facilities 3 to another power storage facility 3 of the power storage system 1. The power storage system 1 can exchange electric power between the plurality of power storage facilities 3 electrically connected by the connection switching circuit 7.

The power storage system 1 includes a diagnosis apparatus 10. The diagnosis apparatus 10 performs diagnosis related to the power storage system 1, and diagnoses a state such as a degradation state for each of the plurality of power storage facilities 3. Further, the diagnosis apparatus 10 may diagnose a state such as a degradation state of each of the plurality of battery modules for each of the power storage facilities 3. In an example, the diagnosis apparatus 10 is a processing apparatus (computer) such as a server, and includes a processing circuit 11 and a storage medium (non-transitory storage medium) 12. The processing circuit 11 includes a processor, an integrated circuit, or the like, and the processor or the like constituting the processing circuit 11 includes any of a central processing unit (CPU), an application specific integrated circuit (ASIC), a microcomputer, a field programmable gate array (FPGA), a digital signal processor (DSP), and the like. The processing circuit 11 may include one processor or the like, or may include a plurality of processors or the like. The storage medium 12 is either a main storage apparatus such as a memory or an auxiliary storage apparatus. The diagnosis apparatus 10 may include only one memory or the like serving as the storage medium 12, or may include a plurality of memories or the like.

The processing circuit 11 performs processing by executing a program or the like stored in the storage medium 12. For example, the processing circuit 11 controls the operation of each of the PCS 6 and the connection switching circuit 7 by executing a program or the like stored in the storage medium 12. As a result, the electrical connection state of each power storage facility 3 with respect to the power grid 2 (the connection state of each of the power storage facilities 3 with the power grid 2) is controlled, and exchange of electric power of each power storage facility 3 through the power grid 2 is controlled. In addition, by controlling the operation of each of the PCSs 6 and the connection switching circuit 7, the electrical connection state of each of the power storage facilities 3 with respect to another power storage facility 3 is controlled in the power storage system 1, and exchange of electric power between the plurality of power storage facilities 3 is controlled. In addition, the processing circuit 11 acquires a measurement result by each of the measurement circuits 5.

In the example of FIG. 1, the storage medium 12 stores a data management program 15 and a diagnosis program 16 as programs to be executed by the processing circuit 11. The processing circuit 11 executes the data management program 15 to write data to the storage medium 12 and read data from the storage medium 12. By executing the diagnosis program 16, the processing circuit 11 performs processing to be described later in the diagnosis of the power storage system 1, that is, processing to be described later in the diagnosis of the states of the plurality of power storage facilities 3. In addition, in a case where the diagnosis apparatus 10 is a processing apparatus such as a server, the processing circuit 11 may be activated by converting electric power from the power grid 2 by the PCS or the like and supplying the converted electric power to the processing circuit 11.

In an example, the diagnosis apparatus 10 includes a plurality of processing apparatuses (computers) such as a plurality of servers, and the processors of the plurality of processing apparatuses cooperate to perform processing to be described later in the diagnosis of the power storage system 1. In another example, the diagnosis apparatus 10 includes a cloud server in a cloud environment. The infrastructure of the cloud environment includes a virtual processor such as a virtual CPU and a cloud memory. Therefore, in a case where the diagnosis apparatus 10 includes a cloud server, the virtual processor performs processing described later in the diagnosis of the power storage system 1 instead of the processing circuit 11. The cloud memory has a function of storing programs, data, and the like, as in the storage medium 12.

In an example, the diagnosis apparatus 10 may include a user interface. In this case, the user interface receives an operation or the like related to diagnosis of the power storage system 1 from the user or the like of the diagnosis apparatus 10 and the power storage system 1. Therefore, the user interface includes any of a button, a mouse, a touch panel, a keyboard, and the like as an operation unit to which an operation is input by the user or the like. The user interface includes a notifier that makes notification of information related to diagnosis of power storage system 1. The notifier makes notification of information by any of screen display, transmission of sound, and the like. Note that the user interface may be provided separately from the processing apparatus constituting the diagnosis apparatus 10.

In the embodiment, the diagnosis apparatus 10 or the like performs the following processing in one diagnosis of the power storage system 1. In one diagnosis of the power storage system 1, a state such as a degradation state is diagnosed for each of the plurality of power storage facilities 3. Further, the diagnosis of the power storage system 1 is periodically performed. In the diagnosis of the power storage system 1, the processing circuit 11 causes the corresponding one of the measurement circuits 5 to measure measurement data for diagnosis for each of the plurality of power storage facilities 3. At this time, the processing circuit 11 allocates some of the plurality of power storage facilities 3 as a facility to be measured whose measurement data for diagnosis is to be measured. Then, the processing circuit 11 charges and discharges each of the power storage facilities 3 allocated as the facility to be measured, and causes the corresponding measurement circuit to measure measurement data for each facility as the facility to be measured. In addition, each of the power storage facilities 3 allocated as the facility to be measured is not connected to the power grid 2, and electric power cannot be exchanged through the power grid 2.

The processing circuit 11 allocates at least some, among the plurality of power storage facilities 3, other than the facility to be measured, that is, at least some facilities other than the power storage facilities 3 allocated as the facility to be measured, as an operation facility that exchanges electric power through the power grid 2. At this time, all of the power storage facilities 3 other than the facility to be measured may be allocated as the operation facility, and only some, among the power storage facilities 3, other than the facility to be measured may be allocated as the operation facility. In a case where only some, of the power storage facility 3, other than the facility to be measured is allocated as the operation facility, in the plurality of power storage facilities 3 of the power storage system 1, there is a power storage facility 3 that is allocated as neither the facility to be measured nor the operation facility. Each of the power storage facilities 3 allocated as the operation facility is connected to the power grid 2 and exchanges electric power through the power grid 2. Therefore, in the power storage system 1, in parallel with measurement of measurement data for diagnosis for each facility as the facility to be measured, the operation facility exchanges electric power through the power grid 2, and the operation facility is operated.

In the diagnosis of the power storage system 1, the processing circuit 11 repeats the allocation of the facility to be measured and the operation facility and the measurement of the measurement data for each facility as the facility to be measured by sequentially changing the power storage facilities 3 to be allocated as the facility to be measured. The allocation of the facility to be measured and the operation facility and the measurement of the measurement data for each facility as the facility to be measured are repeated until the measurement data for diagnosis is measured for all of the plurality of power storage facilities 3 of the power storage system 1. Each facility as the facility to be measured is charged and discharged by exchanging electric power with another power storage facility 3 of the power storage system 1. Then, the processing circuit 11 measures measurement data for diagnosis for each facility as the facility to be measured while charging and discharging each facility as the facility to be measured by exchanging electric power with another power storage facility 3.

In the measurement of the measurement data for diagnosis for each facility as the facility to be measured, the processing circuit 11 charges or discharges each of the power storage facilities 3 allocated as the facility to be measured under the set condition. Then, the processing circuit 11 measures a parameter related to the facility to be measured at each of a plurality of measurement time points during charging or discharging under the set condition for each facility as the facility to be measured. At this time, for each facility as the facility to be measured, the current and the voltage are measured and the temperature may be measured at each of a plurality of measurement time points during charging or discharging under set condition. In addition, the condition for measurement of the measurement data includes the SOC range and the C rate of the facility to be measured in charging or discharging, and may include the temperature of the facility to be measured in charging or discharging. In charging or discharging under the set condition, the charging or discharging is started from the start SOC which is one of the lower limit SOC and the upper limit SOC of the SOC range set as the condition, and the charging or discharging is ended at the end SOC which is the other of the lower limit SOC and the upper limit SOC of the SOC range set as the condition.

Since the measurement data for diagnosis is measured for each facility as the facility to be measured as described above, the measurement data for each facility as the facility to be measured indicates a measurement value of a parameter related to the facility to be measured for each of the plurality of measurement time points during charging or discharging under the set condition. Therefore, the measurement data for each facility as the facility to be measured indicates measurement values such as a current and a voltage of the facility to be measured for each of a plurality of measurement time points during charging or discharging under the set condition. The measurement data for each facility as the facility to be measured indicates a temporal change (time history) of the parameter related to the facility to be measured during charging or discharging under the set condition. Therefore, the measurement data for each facility as the facility to be measured indicates a temporal change (time history) of the current, the voltage, and the like of the facility to be measured during charging or discharging under the set condition.

In addition, the measurement data for each facility as the facility to be measured indicates a measurement value of a parameter related to the facility to be measured for each of a plurality of SOCs (including the start SOC and the end SOC described above) included in the SOC range set as the condition. For example, the measurement data for each facility as the facility to be measured indicates a current, a voltage, and the like of the facility to be measured for each of the plurality of SOCs from the lower limit SOC to the upper limit SOC of the set SOC range.

Here, in each of the power storage facilities 3, an amount of charge (charge level) and the above-described SOC are defined as parameters indicating a state of charge. Then, for each of the power storage facilities 3, the amount of charge in real time is calculated based on the amount of charge at a predetermined time point, a temporal change in current from the predetermined time point, and the like. For example, for each of the power storage facilities 3, the amount of charge in real time is calculated by adding the time integrated value of the current from a predetermined time point to the amount of charge at the predetermined time point.

In each of the power storage facilities 3, a lower limit voltage Vmin and an upper limit voltage Vmax are defined for the voltage. In each of the power storage facilities 3, a state in which the voltage in discharging or charging under a predetermined condition is the lower limit voltage Vmin is defined as a state in which the SOC is 0%, and a state in which the voltage in discharging or charging under a predetermined condition is the upper limit voltage Vmax is defined as a state in which the SOC is 100%. In each of the power storage facilities 3, a charge capacity (amount of charge) until the SOC changes from 0% to 100% in charging under a predetermined condition, or a discharge capacity (amount of discharge) until the SOC changes from 100% to 0% in discharging under a predetermined condition is defined as the battery capacity. For each of the power storage facilities 3, the ratio of the residual amount of charge (residual capacity) until the SOC value is 0% with respect to the battery capacity is the SOC. Since the SOC of each of the power storage facilities 3 is defined as described above, the processing circuit 11 can calculate the SOC of the facility to be measured in real time in a state where the measurement data for each facility as the facility to be measured is measured by charging or discharging under the set condition.

As described above, each facility as the facility to be measured is charged and discharged by exchanging electric power with another power storage facility 3 of the power storage system 1. Therefore, in the measurement of the measurement data for diagnosis for each facility as the facility to be measured, each facility as the facility to be measured is charged or discharged under a set condition by exchanging electric power with another power storage facility 3 of the power storage system 1. In an example, the measurement data is measured while charging each facility as the facility to be measured under a set condition. In this case, each facility as the facility to be measured is charged under the set condition by inputting electric power from another power storage facility 3 of the power storage system 1 to each facility as the facility to be measured. In another example, the measurement data is measured while discharging each facility as the facility to be measured under the set condition. In this case, each facility as the facility to be measured is discharged under a set condition by outputting electric power from each facility as the facility to be measured to another power storage facility 3 of the power storage system 1.

In the measurement of the measurement data for diagnosis for each facility as the facility to be measured, before charging or discharging under the set condition, the SOC of the facility to be measured is adjusted to the start SOC at which charging or discharging under the set condition is started. At this time, by exchanging electric power with another power storage facility 3 of the power storage system 1, the SOC of each facility as the facility to be measured is adjusted to the start SOC. For example, in a case where the SOC of the power storage facility 3 allocated as the facility to be measured is higher than the start SOC, the processing circuit 11 causes the facility to be measured to output electric power to another electrical facility, and discharges the facility to be measured until the SOC decreases to the start SOC. On the other hand, in a case where the SOC of the power storage facility 3 allocated as the facility to be measured is lower than the start SOC, the processing circuit 11 inputs electric power from another electrical facility to the facility to be measured and charges the facility to be measured until the SOC rises to the start SOC.

FIG. 2 is a flowchart illustrating an example of processing performed by the processing circuit 11 of the diagnosis apparatus 10 in a case where the measurement data for diagnosis is measured for each of the plurality of power storage facilities 3 of the power storage system 1. The processing in the example of FIG. 2 is performed in each diagnosis of the power storage system 1. In a case where the process of the example of FIG. 2 is started, the processing circuit 11 allocates the facility to be measured and the operation facility from among the plurality of power storage facilities 3 of the power storage system 1 (S101). At this time, as described above, some of the plurality of power storage facilities 3 are allocated as the facility to be measured, and at least some facilities other than the facility to be measured are allocated as the operation facility. Then, the processing circuit 11 adjusts the SOC of each facility as the facility to be measured to the start SOC by exchanging electric power with another power storage facility 3 of the power storage system 1 (S102).

Then, the processing circuit 11 charges or discharges each facility as the facility to be measured under the set condition by exchanging electric power with another power storage facility 3 of the power storage system 1 (S103). Then, the processing circuit 11 measures the parameter related to the facility to be measured in the state of charging or discharging under the set condition (S104). Unless the measurement of the measurement data for diagnosis of the power storage facilities 3 allocated as the facility to be measured is completed (S105—No), the process returns to S103, and the process of S103 and the process of S104 are repeated. In parallel with the processes of S102 to S105, the processing circuit 11 causes the power storage facilities 3 allocated as the operation facility to exchange electric power through the power grid 2. As a result, even during the processes of S102 to S105, electric power is exchanged with an apparatus outside the power storage system 1 using the operation facility.

In a case where the measurement of the measurement data for diagnosis of the facility to be measured is completed (S105—Yes), the processing circuit 11 determines whether the measurement data for diagnosis has been measured for all of the plurality of power storage facilities 3 of the power storage system 1 (S106). In a case where the measurement data has been measured for all of the power storage facilities 3 (S106—Yes), the process of the example of FIG. 2 ends. On the other hand, in a case where there is a power storage facility 3 for which the measurement data has not been measured (S106—No), the process returns to S101, and the processing circuit 11 allocates the facility to be measured and the operation facility from among the plurality of power storage facilities 3 of the power storage system 1 (S101). At this time, the power storage facility 3 to be allocated as the facility to be measured is changed from the previous allocation of the facility to be measured and the operation facility. In addition, the facility to be measured is allocated from the power storage facility 3 for which measurement data for diagnosis is not measured. Since the processing as described above is performed, in the example of FIG. 2, the allocation of the facility to be measured and the operation facility and the measurement of the measurement data for each facility as the facility to be measured are repeated by sequentially changing the power storage facilities 3 to be allocated as the facility to be measured until the measurement data is measured for all of the plurality of power storage facilities 3 of the power storage system 1.

In the embodiment, as long as each of the power storage facilities 3 allocated as the facility to be measured exchanges electric power with another power storage facility 3 of the power storage system 1, a destination with which each facility as the facility to be measured exchanges electric power is not particularly limited. In an example, each facility as the facility to be measured is charged and discharged by exchanging electric power between the power storage facilities 3 allocated as the facility to be measured. In this case, the processes of S102 and S103 in the example of FIG. 2 are performed by exchanging electric power between the power storage facilities 3 allocated as the facility to be measured. In another example, each facility as the facility to be measured is charged and discharged by exchanging electric power between the power storage facilities 3 allocated as the facility to be measured and the power storage facilities 3 allocated as the operation facility. In this case, the processes of S102 and S103 in the example of FIG. 2 are performed by exchanging electric power between the power storage facilities 3 allocated as the facility to be measured and the power storage facilities 3 allocated as the operation facility. In another example, each facility as the facility to be measured may be charged and discharged by exchanging electric power between the power storage facilities 3 allocated as the facility to be measured and the power storage facilities 3 allocated as neither the facility to be measured nor the operation facility.

Figure 3:
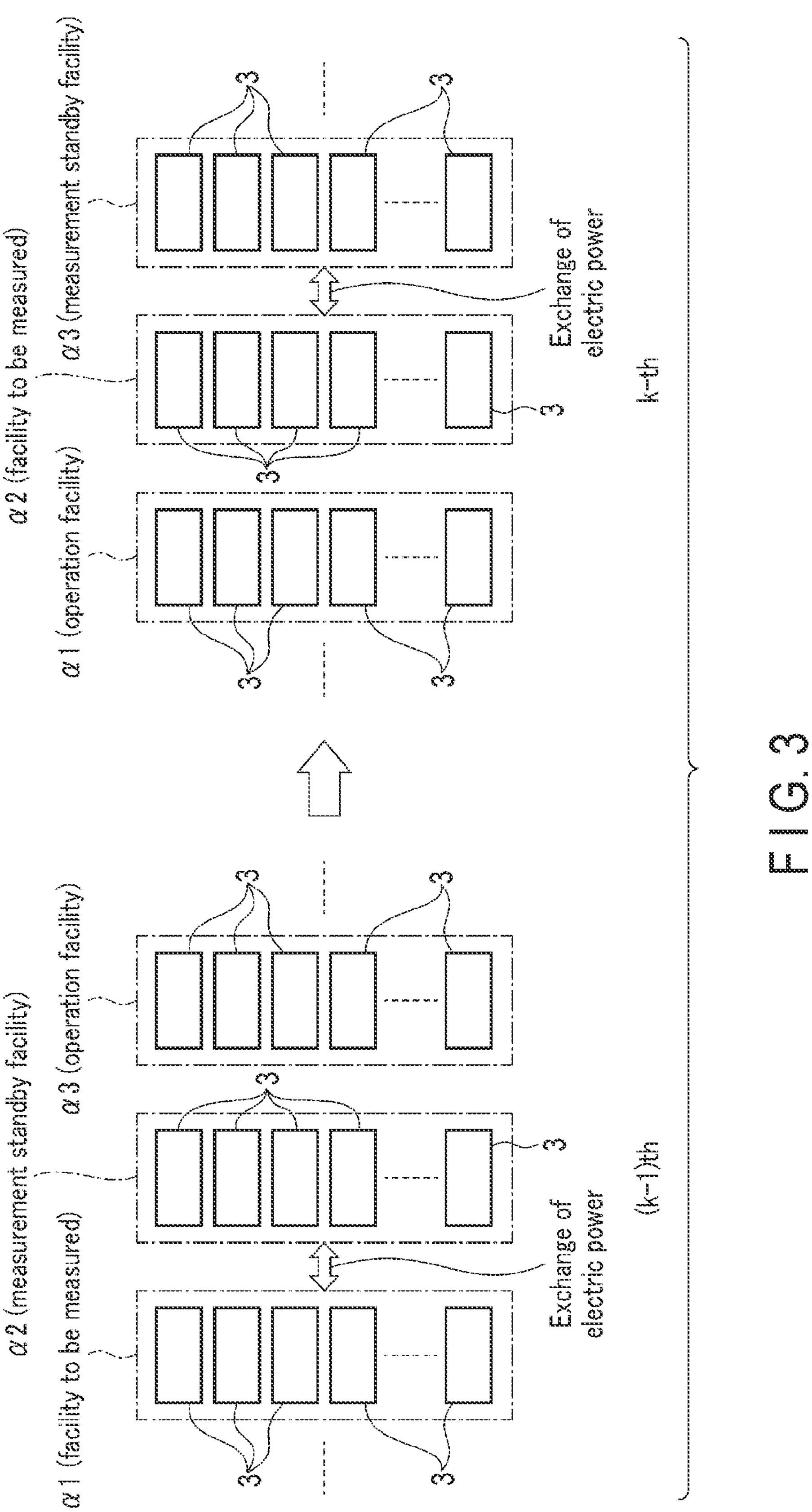
FIG. 3 is a schematic view showing a preferred example of a process of allocating a facility to be measured performed in diagnosis of the power storage system in the embodiment.

FIG. 3 shows a preferred example of a process of allocating the facility to be measured performed in the diagnosis of the power storage system 1. In the example of FIG. 3, the plurality of power storage facilities 3 of the power storage system 1 is grouped into a plurality of groups. In one diagnosis of the power storage system 1, the allocation of the facility to be measured and the operation facility is performed the same number of times as the number of grouped groups. In the example of FIG. 3, the groups $\alpha$1 to $\alpha$3 are included in a plurality of grouped groups. In the (k−1)th (k is an integer of 2 or more) allocation of the facility to be measured and the operation facility, the power storage facilities 3 belonging to the group $\alpha$1 are allocated as the facility to be measured, and the power storage facilities 3 belonging to the group $\alpha$2 are allocated as the measurement standby facility. At this time, the power storage facility 3 serving as the measurement standby facility is allocated from the power storage facility 3 that is not allocated as the facility to be measured and does not measure the measurement data.

In the example of FIG. 3, each facility as the facility to be measured is charged and discharged by exchanging electric power between the power storage facilities 3 allocated as the facility to be measured and the power storage facilities 3 allocated as the measurement standby facility. Therefore, the processes of S102 and S103 in the example of FIG. 2 are performed by exchanging electric power between the power storage facilities 3 allocated as the facility to be measured and the power storage facilities 3 allocated as the measurement standby facility. Therefore, in a case where the (k−1)th allocation of the facility to be measured and the operation facility is performed, each of the power storage facilities 3 belonging to the group $\alpha$1 is adjusted to the start SOC and is charged or discharged under the set condition by exchanging electric power with the power storage facilities 3 belonging to the group $\alpha$2.

In the example of FIG. 3, in the k-th allocation of the facility to be measured and the operation facility, the power storage facilities 3 belonging to the group $\alpha$2 are allocated as the facility to be measured, and the power storage facilities 3 belonging to the group $\alpha$3 are allocated as the measurement standby facility. Therefore, in the k-th allocation of the facility to be measured and the operation facility, the power storage facilities 3 allocated as the measurement standby facility in the (k−1)th allocation of the facility to be measured and the operation facility is allocated as the facility to be measured. In the example of FIG. 3, in the (k+1)th allocation of the facility to be measured and the operation facility, the power storage facilities 3 belonging to the group $\alpha$3 are allocated as the facility to be measured. Therefore, in the example of FIG. 3, the processing circuit 11 allocates the power storage facilities 3 allocated as the measurement standby facility in the previous allocation of the facility to be measured and the operation facility to the facility to be measured.

In the example of FIG. 3, in the allocation of the facility to be measured and the operation facility, the power storage facilities 3 that are allocated as neither the facility to be measured nor the measurement standby facility is allocated as the operation facility. Therefore, in the (k−1)th allocation, the power storage facilities 3, other than the groups $\alpha$1 and $\alpha$2, including the power storage facilities 3 belonging to the group $\alpha$3 are allocated as the operation facility, and in the k-th allocation, the power storage facilities 3, other than the groups $\alpha2$ and $\alpha3$, including the power storage facilities 3 belonging to the group $\alpha1$ are allocated as the operation facility. In addition, the processing circuit 11 may or may not electrically connect the power storage facilities 3 allocated as the measurement standby facility to the power grid 2. That is, the power storage facilities 3 allocated as the measurement standby facility may be able to exchange electric power through the power grid 2 or may not be able to exchange electric power through the power grid 2.

Here, in a case where the facility to be measured and the measurement standby facility are allocated as in the example of FIG. 3, the measurement data for diagnosis for each facility as the facility to be measured is measured by charging under the set condition. In this case, for example, after the (k−1)th allocation is performed, the electric power discharged from the measurement standby facility is input to each facility as the facility to be measured, whereby each facility as the facility to be measured is charged under the set condition. By the discharge to the facility to be measured, the SOC of each facility as the measurement standby facility decreases to the start SOC or an SOC close to the start SOC. In the k-th allocation, since the power storage facilities 3 allocated as the measurement standby facility in the (k−1)th allocation are allocated as the facility to be measured, the power storage facilities 3 discharged to the start SOC or an SOC close to the start SOC are allocated as the facility to be measured. In a case where the facility to be measured and the measurement standby facility are allocated, and the measurement data for diagnosis is measured for each facility as the facility to be measured by charging under the set condition, the SOC is adjusted to the start SOC by discharging the power storage facilities 3 allocated as the facility to be measured in the first allocation to either the measurement standby facility or the operation facility.

In addition, in a case where the facility to be measured and the measurement standby facility are allocated as in the example of FIG. 3, the measurement data for diagnosis for each facility as the facility to be measured is measured by discharging under set condition. In this case, for example, after the (k−1)th allocation is performed, each facility as the measurement standby facility is charged by the electric power output from the facility to be measured, whereby each facility as the facility to be measured is discharged under the set condition. The SOC of each facility as the measurement standby facility rises to the start SOC or an SOC close to the start SOC due to the charging by the electric power from the facility to be measured. In the k-th allocation, since the power storage facilities 3 allocated as the measurement standby facility in the (k−1)th allocation are allocated as the facility to be measured, the power storage facilities 3 charged to the start SOC or an SOC close to the start SOC are allocated as the facility to be measured. In a case where the facility to be measured and the measurement standby facility are allocated, and the measurement data for diagnosis is measured for each facility as the facility to be measured by discharging under the set condition, the SOC is adjusted to the start SOC by charging the power storage facilities 3 allocated as the facility to be measured in the first allocation from either the measurement standby facility or the operation facility.

Figure 4:
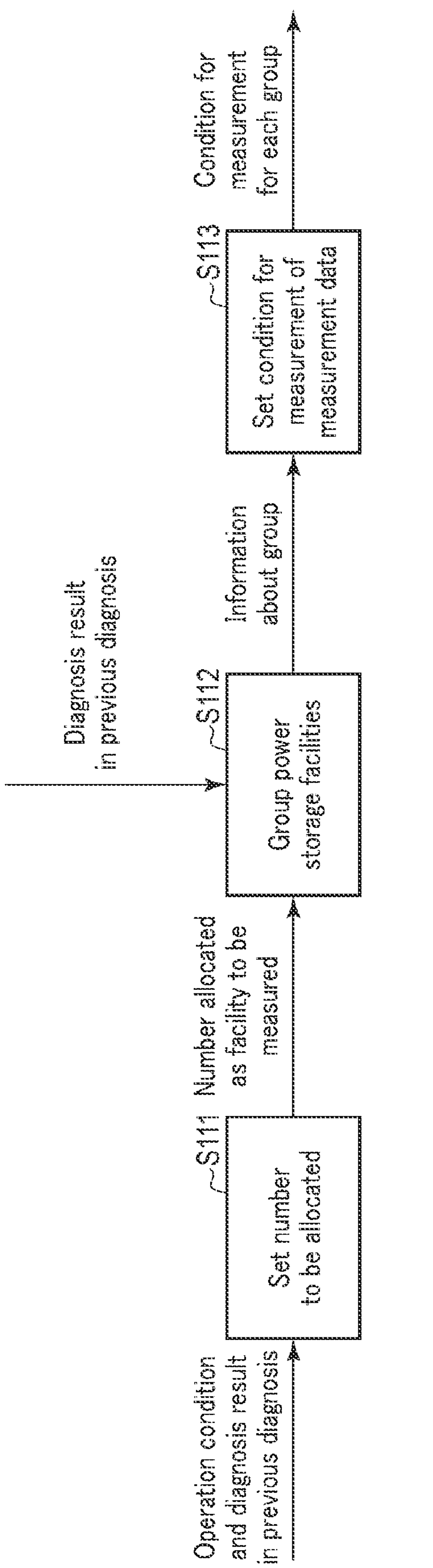
FIG. 4 is a schematic diagram illustrating an example of the setting process performed by a processing circuit of a diagnosis apparatus before measurement data for diagnosis is measured for each of a plurality of power storage facilities of the power storage system in the embodiment.

In the embodiment, the processing circuit 11 performs various types of setting processes before measuring the measurement data for diagnosis for each of the power storage facilities 3 by the processing illustrated in the example of FIG. 2 or the like. FIG. 4 shows an example of the setting process performed by the processing circuit 11 of the diagnosis apparatus 10 before measuring the measurement data for diagnosis for each of the plurality of power storage facilities 3 of the power storage system 1. The setting process in the example of FIG. 4 is performed every time the power storage system 1 is diagnosed once. In the setting process of the example of FIG. 4, the processing circuit 11 sets the number of power storage facilities 3 to be allocated as each of the facility to be measured and the operation facility based on the operation condition of the power storage system 1 in exchange of electric power through the power grid 2 and the results of diagnosis of the plurality of power storage facilities 3 in the previous diagnosis of the power storage system 1 (S111).

The operation condition of the power storage system 1 in exchange of electric power through the power grid 2 includes a load n to the power storage system 1 in exchange of electric power through the power grid 2. In each of the output of the electric power from the power storage system 1 through the power grid 2 and the input of the electric power to the power storage system 1 through the power grid 2, the load n increases as the electric power input/output in the power storage system 1 increases. In the setting of S111, in a case where the other conditions are the same, the processing circuit 11 increases the number of power storage facilities 3 to be allocated as the operation facility, and decreases the number of power storage facilities 3 to be allocated as the facility to be measured as the load $\eta$ increases. For example, assuming that the other conditions are the same, in a case where the load $\eta$ is a value $\eta$1, 50% of the total number of power storage facilities 3 provided in the power storage system 1 is set as the number of power storage facilities 3 to be allocated as the facility to be measured, in a case where the load $\eta$ is a value $\eta$2 higher than the value $\eta$1, 30% of the total number of power storage facilities 3 provided in the power storage system 1 is set as the number of power storage facilities 3 to be allocated as the facility to be measured, and in a case where the load $\eta$ is a value $\eta$3 higher than the value $\eta$2, 10% of the total number of power storage facilities 3 provided in the power storage system 1 is set as the number of power storage facilities 3 to be allocated as the facility to be measured.

In the results of diagnosis of the plurality of power storage facilities 3 in the previous diagnosis, a degradation state and the like are indicated for each of the power storage facilities 3. In the setting of S111, the processing circuit 11 calculates a degradation index $\varepsilon$ indicating the degree of degradation of the entire power storage system 1 at the time of the previous diagnosis based on the degradation state or the like of each of the power storage facilities 3. For example, the higher the degree of degradation of the power storage system 1 is, the larger value the degradation index $\varepsilon$ has. In a case where other conditions are the same, the processing circuit 11 increases the number of power storage facilities 3 allocated as the operation facility and decreases the number of power storage facilities 3 allocated as the facility to be measured as the degree of degradation indicated by the degradation index $\varepsilon$ is high. For example, assuming that the other conditions are the same, in a case where the degradation index $\varepsilon$ is a value $\varepsilon$1, 50% of the total number of power storage facilities 3 provided in the power storage system 1 is set as the number of power storage facilities 3 to be allocated as the facility to be measured, in a case where the degradation index $\varepsilon$ is a value 82 having a higher degree of degradation than the value $\varepsilon$1, 30% of the total number of power storage facilities 3 provided in the power storage system 1 is set as the number of power storage facilities 3 to be allocated as the facility to be measured, and in a case where the degradation index $\varepsilon$ is a value $\varepsilon$3 having a higher degree of degradation than the value ε2, 10% of the total number of power storage facilities 3 provided in the power storage system 1 is set as the number of power storage facilities 3 to be allocated as the facility to be measured.

In a case where the setting of S111 is performed, the processing circuit 11 groups the plurality of power storage facilities 3 into a plurality of groups based on the number of power storage facilities 3 to be allocated as the facility to be measured set in S111 and the results of diagnosis of the plurality of power storage facilities 3 in the previous diagnosis of the power storage system 1 (S112). That is, group setting is performed for the plurality of power storage facilities 3 provided in the power storage system 1. Here, in the process of S112, the number of groups by grouping decreases as the number of power storage facilities 3 allocated as the facility to be measured increases. For example, in a case where 10%, 20%, and 50% of the total number of power storage facilities 3 are allocated as the facility to be measured, the power storage facilities 3 are divided into 10 groups, 5 groups, and 2 groups, respectively.

In a state where the allocation of the facility to be measured and the operation facility and the measurement of the measurement data for each facility as the facility to be measured are repeated by the processing or the like of the example of FIG. 2, the processing circuit sequentially changes the power storage facilities 3 to be allocated as the facility to be measured in units of groups grouped in S112. For example, in S112, the plurality of power storage facilities 3 of the power storage system 1 is grouped into five groups β1 to β5. In this case, in the measurement of the measurement data for diagnosis of each of the plurality of power storage facilities 3, the allocation of the facility to be measured and the operation facility is performed five times. Then, by the first to fifth allocations, for example, the power storage facilities 3 allocated as the facility to be measured are sequentially changed in the order of the groups β1, β2, β3, β4, and β5.

In the grouping in S112, the processing circuit 11 sets the power storage facilities 3 belonging to each of the plurality of groups based on the degradation states of the plurality of power storage facilities 3 indicated as the result of diagnosis in the previous diagnosis of the power storage system 1. At this time, the processing circuit 11 determines whether the variation in the degradation state between the plurality of power storage facilities 3 in the previous diagnosis falls within the reference range. In a case where the variation in the degradation state between the plurality of power storage facilities 3 falls within the reference range, such as in a case where the degree of degradation is substantially the same between all the power storage facilities 3 provided in the power storage system 1, the power storage facilities 3 belonging to each of the plurality of groups are randomly set. On the other hand, in a case where the variation in the degradation state between the plurality of power storage facilities 3 exceeds the reference range, such as in a case where some of the power storage facilities 3 are greatly deteriorated as compared with another power storage facility 3, the power storage facilities 3 belonging to each of the plurality of groups are set to a state in which the variation in the degradation state between the power storage facilities 3 belonging to the same group is as small as possible.

Since the grouping is performed as described above, in a case where the variation in the degradation state between the plurality of power storage facilities 3 exceeds the reference range, the plurality of power storage facilities 3 of the power storage system 1 is grouped so that the variation in the degradation state between the power storage facilities 3 belonging to the same group is as small as possible. In an example, the variation in the degradation state between the plurality of power storage facilities 3 exceeds the reference range, and the plurality of power storage facilities 3 of the power storage system 1 is grouped into the five groups β1 to β5 as described above based on the degradation state of the power storage facility 3 in the previous diagnosis. The power storage facilities 3 having a relatively low degree of degradation among the plurality of power storage facilities 3 belong to each of the groups β1 and β2. In addition, the power storage facilities 3 having a higher degree of degradation than the power storage facilities 3 belonging to the groups β1 and β2 belong to the group β3, and the power storage facilities 3 having a higher degree of degradation than the power storage facilities 3 belonging to the group β3 belong to the group β4. The power storage facilities 3 having a higher degree of degradation than the power storage facilities 3 belonging to the group β4 belong to the group β5. As a result, for each of the groups β1 to β5, the variation in the degradation state between the belonging power storage facilities 3 can be suppressed as small as possible.

After performing the grouping in S112, the processing circuit 11 sets the condition for measurement of the measurement data for diagnosis for each group based on the information about the grouped group (S113). In the information about the group, the power storage facilities 3 belonging to each of the plurality of groups and the degradation state of the power storage facilities 3 belonging to each of the plurality of groups are indicated. Therefore, in S113, the condition for measurement of the measurement data for diagnosis is set for each of the grouped groups based on the degradation state in the previous diagnosis of the power storage facilities 3 belonging to the each group. As described above, the condition for measurement of the measurement data for diagnosis may include the SOC range and the C rate of the facility to be measured in charging or discharging, and may include the temperature of the facility to be measured in charging or discharging.

In the setting of the condition in S113, at least one of setting to low the C rate of the facility to be measured in charging or discharging as the degree of degradation of the power storage facilities 3 belonging is high and setting to wide the SOC range of the facility to be measured in charging or discharging as the degree of degradation of the belonging power storage facility 3 is high is performed. In addition, setting to low temperature of the facility to be measured in charging or discharging as the degree of degradation of the power storage facilities 3 belonging is high may be performed.

In an example, the plurality of power storage facilities 3 of the power storage system 1 is grouped into five groups β1 to β5 as described above. For each of the groups β1 and β2 in which the power storage facilities 3 belonging to the groups have a relatively low degree of degradation, the C rate is set to 0.5 C, and the SOC range is set from 20% to 100% as a condition for measurement of measurement data. For the group β3 in which the power storage facilities 3 belonging to the group have a higher degree of degradation than the groups β1 and β2, the C rate is set to 0.3 C and the SOC range is set from 20% to 100% as a condition for measurement of the measurement data. For the group β4 in which the power storage facilities 3 belonging to the group have a higher degree of degradation than the group β3, the C rate is set to 0.2 C, and the SOC range is set from 20% to 100% as a condition for measurement of the measurement data. Therefore, the group β3 has the C rate in the measurement of the measurement data set to be lower than the groups β1 and β2, and the group β4 has the C rate in the measurement of the measurement data set to be lower than the group β3. In addition, for the group β5 in which the power storage facilities 3 belonging to the group have a higher degree of degradation than the group β4, the C rate is set to 0.2 C and the SOC range is set from 0% to 100% as a condition for measurement of the measurement data. Therefore, the group β5 has the SOC range in the measurement of the measurement data set to wider than the group β4.

In the embodiment and the like, the processing circuit 11 performs diagnosis by analyzing measurement data for diagnosis measured as described above for each of the plurality of power storage facilities 3. FIG. 5 illustrates an example of processing in analysis of the measurement data for diagnosis for one power storage facility 3 performed by the processing circuit 11 of the diagnosis apparatus 10. In the embodiment and the like, measurement data for diagnosis is analyzed in the same manner as in the example of FIG. 5 and the like for other power storage facilities 3. The analysis of the measurement data may be sequentially performed from the power storage facility 3 where the measurement data is measured, or may be performed after the measurement data is measured for all the power storage facilities 3.

In a case where the process of the example of FIG. 5 is started, the processing circuit 11 analyzes the measurement data for diagnosis to analyze the temporal change in the current and the voltage of the power storage facility 3 in charge or discharge under the set condition. That is, the processing circuit 11 performs charge curve analysis or discharge curve analysis for the power storage facility 3 (S121). By the charge curve analysis or the discharge curve analysis, the temporal change in charge or discharge under the set condition is analyzed for the parameter related to the power storage facility 3 measured in the measurement data. Then, the processing circuit 11 estimates the internal state of the power storage facility 3 based on the analysis result by the charge curve analysis or the discharge curve analysis (S122). The internal state of each of the power storage facilities 3 is indicated by an internal state parameter.

Figure 6:
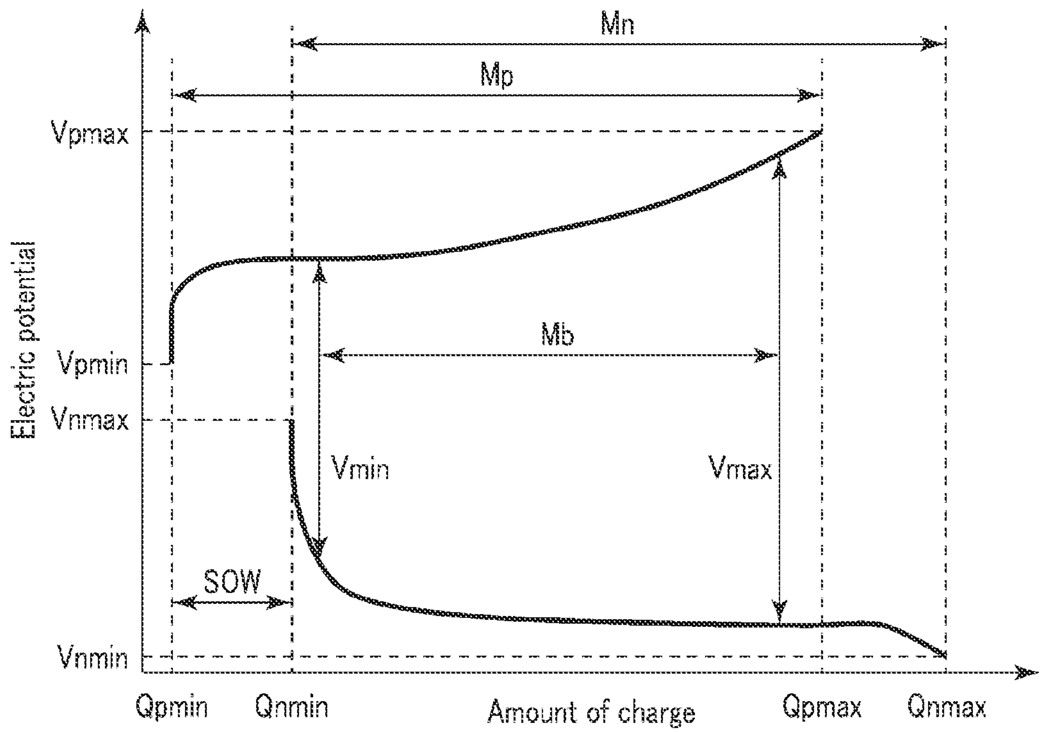
FIG. 6 is a schematic view for explaining an internal state parameter indicating an internal state of the power storage facility.

FIG. 6 describes internal state parameters indicating an internal state of the power storage facility 3. In FIG. 6, the abscissa axis represents the amount of charge, and the ordinate axis represents the electric potential. As shown in FIG. 6, in each of the power storage facilities 3, a lower limit electric potential Vpmin and an upper limit electric potential Vpmax are defined for the positive electrode electric potential, and the positive electrode electric potential increases as the amount of charge of the positive electrode increases. In the positive electrode, the amount of charge in a state where the positive electrode electric potential is the lower limit electric potential Vpmin is an initial amount of charge (initial charge level) Qpmin of the positive electrode, and the amount of charge in a state where the positive electrode electric potential is the upper limit electric potential Vpmax is an upper limit amount of charge (upper limit charge level) Opmax of the positive electrode. In each of the power storage facilities 3, the amount of charge until the positive electrode reaches the upper limit amount of charge Opmax from the initial amount of charge Qpmin is a positive electrode capacity Mp. In each of the power storage facilities 3, a lower limit electric potential Vnmin and an upper limit electric potential Vnmax are defined for the negative electrode electric potential, and the negative electrode electric potential decreases as the amount of charge of the negative electrode increases. In the negative electrode, the amount of charge in a state where the negative electrode electric potential is the upper limit electric potential Vnmax is an initial amount of charge (initial charge level) Qnmin of the negative electrode, and the amount of charge in a state where the negative electrode electric potential is the lower limit electric potential Vnmin is an upper limit amount of charge (upper limit charge level) Qnmax of the negative electrode. In each of the power storage facilities 3, the amount of charge until the negative electrode reaches the upper limit amount of charge Qnmax from the initial amount of charge Qnmin is the negative electrode capacity Mn.

In each of the power storage facilities 3, the internal state parameters indicating the internal state include the positive electrode capacity Mp, the negative electrode capacity Mn, the initial amount of charge Qpmin of the positive electrode, and the initial amount of charge Qnmin of the negative electrode described above. The internal state parameters include a positive electrode mass which is a parameter corresponding to the positive electrode capacity Mp and a negative electrode mass which is a parameter corresponding to the negative electrode capacity Mn. The positive electrode mass can be calculated based on the positive electrode capacity Mp and the type of material forming the positive electrode in the battery module or the like of the power storage facility 3. Similarly, the negative electrode mass can be calculated based on the negative electrode capacity Mn and the type of the material forming the negative electrode in the battery module or the like of the power storage facility 3. The internal state parameters of the power storage facility 3 include a positive electrode capacity retention ratio, a negative electrode capacity retention ratio, and the like. Here, the positive electrode capacity retention ratio is a ratio of the estimated positive electrode capacity to the positive electrode capacity at the start of use of the power storage facility 3, and the negative electrode capacity retention ratio of the power storage facility 3 is a ratio of the estimated negative electrode capacity to the negative electrode capacity at the start of use of the power storage facility 3.

The internal state parameter of the power storage facility 3 includes a shift of operation window (SOW) which is a deviation between the initial amount of charge Qpmin of the positive electrode and the initial amount of charge Qnmin of the negative electrode. The internal state parameter includes a parameter related to the internal resistance of the power storage facility 3. The parameters related to the internal resistance may include resistance in each of the positive electrode and the negative electrode in addition to the internal resistance in the entire power storage facility 3. The parameters related to the internal resistance may include an ohmic resistance, a reaction resistance, and a diffusion resistance. In FIG. 6, the battery capacity Mb, which is one of the battery characteristics of the power storage facility 3, is also shown. As described above, the battery capacity Mb corresponds to the amount of charge until the voltage of the power storage facility 3 (the difference between the positive electrode electric potential and the negative electrode electric potential) changes from the lower limit voltage Vmin to the upper limit voltage Vmax.

In the embodiment and the like, relational data indicating the relationship of the internal state of the power storage facility 3 with respect to at least one of the voltage and the current of the power storage facility 3 is stored in the storage medium 12. Therefore, the relational data indicates the relationship between the parameter related to the power storage facility 3 measured in the measurement of the measurement data for diagnosis and the internal state of the power storage facility 3. The relational data indicates, for example, a calculation expression for calculating at least one of the voltage and the current of the power storage facility 3 from one or more of the internal state parameters of the power storage facility 3 described above. The relationship of the internal state with respect to each of the current and the voltage of the power storage facility 3 changes according to the temperature or the like of the power storage facility 3. Therefore, in the relational data, the relationship of the internal state of the power storage facility 3 with respect to at least one of the current and the voltage of the power storage facility 3 may be indicated for each of a plurality of temperatures different from each other.

In the charge curve analysis or the discharge curve analysis in S121, the processing circuit 11 performs fitting calculation (regression calculation) using the measurement result regarding the voltage and the current of the power storage facility 3 included in the measurement data for diagnosis and the above-described relational data indicating the relationship in the internal state of the power storage facility 3 with respect to the voltage, the current, and the like of the power storage facility 3. At this time, in the calculation expression for calculating at least one of the voltage and the current of the power storage facility 3 from the internal state of the power storage facility 3, fitting calculation is performed using one or more of the internal state parameters as variables. Then, the processing circuit 11 calculates one or more internal states to be variables so that the difference in the voltage, the current, and the like of the power storage facility 3 between the measurement value in the measurement data for diagnosis and the calculation value using the calculation expression indicated by the relational data is as small as possible. By calculating the internal state parameter by fitting calculation as described above, the internal state of the power storage facility 3 is estimated. Therefore, by performing the processes of S121 and S122, the internal state of the power storage facility 3 is estimated based on the measurement data for diagnosis and the relational data indicating the relationship between the parameter measured in the measurement data and the internal state.

Note that a method of estimating the internal state of the battery by charge curve analysis or the like is disclosed in Reference Literature 1 (Japanese Patent No. 6567583) or the like. In Reference Literature 1, the internal state of the battery is estimated by performing fitting calculation using measurement data of the current and the voltage of the battery and relational data indicating the relationship of the internal state of the battery with respect to the voltage and the current of the battery. In the embodiment, the internal state of the power storage facility 3 may be estimated as in the estimation of the internal state of the battery in Reference Literature 1.

In the example of FIG. 5, in a case where the internal state of the power storage facility 3 is estimated as described above, the processing circuit 11 and the like estimate the battery characteristics of the power storage facility 3 based on the estimated internal state of the power storage facility 3 (S123). The battery characteristics of the power storage facility 3 include, in addition to the battery capacity Mb described above, an open circuit voltage (OCV), an OCV curve, and the like of the power storage facility 3. Here, the OCV curve is a function indicating a relationship between a parameter other than the OCV and the OCV, and is, for example, a function indicating a relationship between the OCV and the SOC. The internal resistance of the entire power storage facility 3 indicates the internal state of the power storage facility 3 as described above, and also indicates the battery characteristics of the power storage facility 3. Reference Literature 1 describes a method for estimating battery characteristics of a battery based on an internal state of the battery. In the embodiment and the like, the battery characteristics of the power storage facility 3 may be estimated as in the estimation of the battery characteristics of the battery in Reference Literature 1. In an example, the battery characteristics of the power storage facility 3 may not be estimated.

In addition, the processing circuit 11 and the like determine the degradation state of the power storage facility 3 based on the estimation result of the internal state of the power storage facility 3 (S124). In the determination of the degradation state of the power storage facility 3, the estimation result of the battery characteristics of the power storage facility 3 may be used in addition to the estimation result of the internal state of the power storage facility 3. At this time, for example, the degradation state is determined by calculating the above-described degradation index ε for each of the power storage facilities 3. In an example, the smaller the estimated positive electrode capacity Mp is, the higher the degree of degradation of the power storage facility 3 is determined to be and the smaller the estimated negative electrode capacity Mn is, the higher the degree of degradation of the power storage facility 3 is determined to be. In a case where the battery capacity Mb is estimated, the smaller the estimated battery capacity Mb is, the higher the degree of degradation of the power storage facility 3 is determined to be. For the initial amounts of charge Qpmin and Qnmin, the SOW, and the like, the larger the change from the start of use of the power storage facility 3 is, the higher the degree of degradation of the power storage facility 3 is determined to be. Similarly, regarding the parameter related to the internal resistance of the power storage facility 3, the larger the change from the start of use of the power storage facility 3 is, the higher the degree of degradation of the power storage facility 3 is determined to be.

In addition, the processing circuit 11 and the like evaluate the safety of the power storage facility 3 based on the estimation result of the internal state of the power storage facility 3 (S125). In the evaluation of the safety of the power storage facility 3, the estimation result of the battery characteristics of the power storage facility 3 may be used in addition to the estimation result of the internal state of the power storage facility 3. The storage medium 12 stores thermal stability data related to heat generation in the power storage facility 3 in a case where the power storage facility 3 is exposed to a high temperature, and the thermal stability data indicates a relationship of a calorific value in the power storage facility 3 with respect to an external temperature in a case where the external temperature of the power storage facility 3 fluctuates due to exposure of the power storage facility 3 to a high temperature or the like. In the thermal stability data, the relationship of the calorific value in the power storage facility 3 with respect to the external temperature is indicated by a plurality of patterns in which any of the internal state and the battery characteristic of the power storage facility 3 is different from each other, and even in a case where the internal state and the battery characteristic of the power storage facility 3 are the same, the relationship of the calorific value in the power storage facility 3 with respect to the external temperature is indicated by a plurality of patterns in which the SOC of the power storage facility 3 is different from each other.

The processing circuit 11 calculates a calorific value in a case where the external temperature of the power storage facility 3 fluctuates based on the estimated internal state, the thermal stability data, and the like. Then, based on the calculated calorific value, the processing circuit 11 calculates, as the temperature reached by the power storage facility 3, a temperature which the power storage facility 3 reaches due to heat generation in a case where the external temperature fluctuates. Then, the processing circuit 11 uses, as a safety index, any of the calculated reached temperature, the amount of temperature rise from the heat generation start temperature at the start of heat generation in the power storage facility 3 due to the fluctuation in the external temperature to the reached temperature, the time to reach from the heat generation start temperature to the reached temperature, and the temperature rise speed from the heat generation start temperature to the reached temperature. Then, the processing circuit 11 evaluates the safety of the power storage facility 3 based on the safety index. At this time, for example, the operation of the power storage facility 3 determined to be safe is continued, and the operation of the power storage facility 3 determined to be unsafe is stopped.

Note that the thermal stability data of the battery is shown in Reference Literature 1, and Reference Literature 1 shows a method for evaluating the safety of the battery using the estimation result of the internal state of the battery and the thermal stability data of the battery. In the embodiment, the safety of the power storage facility 3 may be evaluated as in the evaluation of the safety of the battery in Reference Literature 1. In an example, the safety of the power storage facility 3 may not be evaluated.

In addition, the processing circuit 11 and the like predict the end of the life of the power storage facility 3 based on the estimation result of the internal state of the power storage facility 3 (S126). In the prediction of the end of the life of the power storage facility 3, the estimation result of the battery characteristics of the power storage facility 3 may be used in addition to the estimation result of the internal state of the power storage facility 3. For each of the internal state parameters estimated as the internal state in the diagnosis, a threshold value corresponding to the end of the life of the power storage facility 3 is set. In a case where one or more of the internal state parameters estimated in the diagnosis have reached the threshold value, the processing circuit 11 determines that the end of the life of the power storage facility 3 is reached.

Further, in an example, in a case where the end of the life of the power storage facility 3 is not reached, that is, in a case where none of the estimated internal state parameters has reached the threshold value, the processing circuit 11 estimates the temporal change after the real time for each of the internal state parameters based on the estimation result of the internal state in each of the diagnosis performed in real time and the previous diagnosis. Then, for each of the internal state parameters, the processing circuit 11 predicts the time at which the threshold value corresponding to the end of the life is reached based on the estimated temporal change. Then, for example, the processing circuit 11 predicts the earliest time among the times in a case where the internal state parameter reaches the threshold value as the end of the life of the power storage facility 3. In an example, the safety of the power storage facility 3 may not be evaluated.

As described above, in the embodiment, some of the plurality of power storage facilities 3 are allocated as the facility to be measured, and at least some facilities other than the facility to be measured are allocated as the operation facility that exchanges electric power through the power grid 2. Then, each facility as the facility to be measured is charged and discharged by exchanging electric power with another power storage facility 3 of the power storage system 1, and measurement data for diagnosis of each facility as the facility to be measured is measured. The allocation of the facility to be measured and the operation facility and the measurement of the measurement data for each facility as the facility to be measured are repeated by sequentially changing the power storage facilities 3 to be allocated as the facility to be measured until the measurement data is measured for all of the plurality of power storage facilities 3. By performing such processing, even in a state where measurement data is measured in the facility to be measured, the power storage system 1 continues exchange of electric power through the power grid 2 by the operation facilities which are at least some facilities other than the facility to be measured. Therefore, without simultaneously stopping the operation of all of the plurality of power storage facilities 3, measurement data for diagnosis is measured for all of the plurality of power storage facilities 3 and all of the plurality of power storage facilities 3 can be appropriately diagnosed.

By operating the power storage facilities 3 allocated as the operation facility even in a state where the measurement data is measured in the facility to be measured, for example, the power storage system 1 can be used as a virtual power plant while measuring the measurement data in some of the plurality of power storage facilities 3. That is, monetization can be performed using the power storage system 1 while measurement data is measured by some of the plurality of power storage facilities 3. As a result, it is possible to increase revenue obtained by the power storage system 1 exchanging electric power through the power grid 2.

In addition, in a state where measurement data for diagnosis is measured, in each facility as the facility to be measured, electric power is not input or output from the outside of the power storage system 1, and each facility as the facility to be measured is charged and discharged by exchanging electric power with another power storage system 1 of the power storage system 1. Since the measurement data is measured in a state where electric power is not exchanged between the outside of the power storage system 1 and the facility to be measured through the power grid 2, it is possible to measure the measurement data for each facility as the facility to be measured in a state where there is almost no temporal fluctuation of electric power.

In the example of FIG. 3 and the like, in the allocation of the facility to be measured and the operation facility, the power storage facility 3 serving as the measurement standby facility is allocated from the power storage facility 3 that is not allocated as the facility to be measured and does not measure the measurement data. In the measurement of the measurement data for each facility as the facility to be measured, each facility as the facility to be measured is charged and discharged by exchanging electric power between the power storage facilities 3 allocated as the facility to be measured and the power storage facilities 3 allocated as the measurement standby facility. In the allocation of the facility to be measured and the operation facility, the power storage facilities 3 allocated as the measurement standby facility in the previous allocation of the facility to be measured and the operation facility are allocated as the facility to be measured. By performing such a process, the power storage facilities 3 which becomes to the start SOC or an SOC close to the start SOC by exchange of electric power after being allocated as the measurement standby facility are allocated as the facility to be measured. As a result, the time and effort for adjusting the power storage facilities 3 allocated as the facility to be measured to the start SOC for starting charging or discharging under the set condition are reduced, and the time for adjusting the facility to be measured to the start SOC is shortened.

In an example of the embodiment, the number of power storage facilities 3 to be allocated as each of the facility to be measured and the operation facility is set based on the operation condition of the power storage system 1 in exchange of electric power through the power grid 2 and the results of diagnosis of the plurality of power storage facilities 3 in the previous diagnosis of the power storage system 1. Therefore, even in a state where measurement data for diagnosis is measured, the power storage facilities 3 whose number is necessary for the operation of the power storage system 1 is appropriately allocated as the operation facility. Therefore, even in a state where the measurement data is measured, the power storage system 1 is appropriately operated.

In an example of the embodiment, in a state where the power storage facilities 3 of the power storage system 1 are grouped into a plurality of groups and the allocation of the facility to be measured and the operation facility and the measurement of the measurement data for each facility as the facility to be measured are repeated, the power storage facilities 3 to be allocated as the facility to be measured are sequentially changed in units of the grouped groups. In the grouping, the plurality of power storage facilities 3 is grouped so that the variation in the degradation state between the power storage facilities 3 belonging to the same group is as small as possible. Then, the condition for measurement of the measurement data for diagnosis is set for each of the grouped groups based on the degradation state in the previous diagnosis of the power storage facilities 3 belonging to the each group. As a result, a condition corresponding to the degradation state is set for each of the plurality of power storage facilities 3 as a charge or discharge condition in measurement of the measurement data. Since the measurement data for each of the power storage facilities 3 under the condition corresponding to the degradation state is measured, the estimation accuracy and the like of the internal state of each of the power storage facilities 3 are improved, and the diagnosis of the power storage system 1 is performed with high accuracy.

In at least one embodiment or example described above, some of the plurality of power storage facilities are allocated as the facility to be measured, and at least some facilities other than the facility to be measured are allocated as the operation facility that exchanges electric power through the power grid. In the diagnosis method, each facility as the facility to be measured is charged and discharged by exchanging electric power with another power storage facility of the power storage system, and measurement data for diagnosis of each facility as the facility to be measured is measured. In the diagnosis method, the allocation of the facility to be measured and the operation facility and the measurement of the measurement data for each facility as the facility to be measured are repeated by sequentially changing the power storage facilities to be allocated as the facility to be measured until the measurement data is measured for all of the plurality of power storage facilities. As a result, it is possible to provide a diagnosis method, a diagnosis apparatus, and a diagnosis program of a power storage system, and a power storage system capable of appropriately diagnosing all of the plurality of power storage facilities without simultaneously stopping the operation of all of the plurality of power storage facilities.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A diagnosis method of a power storage system, the power storage system including a plurality of power storage facilities connected to a power grid through a connection switching circuit controlled by a processing circuit, the method comprising:

allocating by the connection switching circuit controlled by the processing circuit at least one of the plurality of power storage facilities as a facility to be measured and allocating by the connection switching circuit controlled by the processing circuit at least one of the rest of the plurality facilities other than the facility to be measured as an operation facility that exchanges electric power through a power grid;

charging and discharging by the connection switching circuit controlled by the processing circuit each facility as the facility to be measured by exchanging electric power with another power storage facility of the power storage system, and measuring measurement data for diagnosis of each facility as the facility to be measured; and repeating by the connection switching circuit controlled by the processing circuit allocation of the facility to be measured and the operation facility and a measurement of the measurement data for each facility as the facility to be measured by sequentially changing power storage facilities to be allocated as the facility to be measured until the measurement data is measured for all of the power storage facilities, wherein the allocating the facility to be measured and the operation facility includes allocating power storage facilities serving as a measurement standby facility from power storage facilities that are not allocated as the facility to be measured and do not measure the measurement data, the measuring the measurement data for each facility as the facility to be measured includes charging and discharging each facility as the facility to be measured by exchanging the electric power between power storage facilities allocated as the facility to be measured and power storage facilities allocated as the measurement standby facility, and the allocating the facility to be measured and the operation facility includes allocating the power storage facilities allocated as the measurement standby facility in a previous allocation of the facility to be measured and the operation facility as the facility to be measured.

2. The diagnosis method according to claim 1, further comprising: setting the number of power storage facilities to be allocated as each of the facility to be measured and the operation facility based on an operation condition of the power storage system in exchange of the electric power through the power grid and results of diagnosis of the power storage facilities in previous diagnosis of the power storage system.

3. The diagnosis method according to claim 2, further comprising:

grouping the power storage facilities into a plurality of groups based on the number of power storage facilities to be allocated as the facility to be measured and the results of diagnosis of the power storage facilities in the previous diagnosis of the power storage system, wherein the method includes sequentially changing power storage facilities to be allocated as the facility to be measured in units of grouped groups in a state where allocation of the facility to be measured and the operation facility and measurement of the measurement data for each facility as the facility to be measured are repeated.

4. The diagnosis method according to claim 3, wherein the grouping the power storage facilities into the groups includes grouping, based on a degradation state of the power storage facilities indicated as a result of diagnosis in the previous diagnosis, the power storage facilities so that a variation in the degradation state between power storage facilities belonging to a same group is as small as possible.

5. The diagnosis method according to claim 3, further comprising: setting, for each of the grouped groups, a condition for measurement of the measurement data for diagnosis based on a degradation state in the previous diagnosis of the power storage facility belonging to the each group.

6. The diagnosis method according to claim 1, further comprising: analyzing the measurement data for each of the power storage facilities.

7. The diagnosis method according to claim 6, wherein the analyzing the measurement data for each of the power storage facilities includes estimating, based on the measurement data for diagnosis and relational data indicating a relationship between a parameter measured in the measurement data and an internal state, the internal state for each of the power storage facilities.

8. The diagnosis method according to claim 7, wherein the analyzing the measurement data for each of the power storage facilities includes performing at least one of safety evaluation and prediction of an end of a life for each of the power storage facilities based on the estimated internal state.

9. A diagnosis apparatus of a power storage system, the power storage system including a plurality of power storage facilities connected to a power grid through a connection switching circuit controlled by a processing circuit, the diagnosis apparatus comprising a processor implementing:

allocating by the connection switching circuit controlled by the processing circuit at least one of the plurality of power storage facilities as a facility to be measured and allocating by the connection switching circuit controlled by the processing circuit at least one of the rest of the plurality facilities other than the facility to be measured as an operation facility that exchanges electric power through a power grid;

charging and discharging by the connection switching circuit controlled by the processing circuit each facility as the facility to be measured by exchanging electric power with another power storage facility of the power storage system, and measuring measurement data for diagnosis of each facility as the facility to be measured; and repeating by the connection switching circuit controlled by the processing circuit allocation of the facility to be measured and the operation facility and a measurement of the measurement data for each facility as the facility to be measured by sequentially changing power storage facilities to be allocated as the facility to be measured until the measurement data is measured for all of the power storage facilities, wherein the allocating the facility to be measured and the operation facility includes allocating power storage facilities serving as a measurement standby facility from power storage facilities that are not allocated as the facility to be measured and do not measure the measurement data, the measuring the measurement data for each facility as the facility to be measured includes charging and discharging each facility as the facility to be measured by exchanging the electric power between power storage facilities allocated as the facility to be measured and power storage facilities allocated as the measurement standby facility, and the allocating the facility to be measured and the operation facility includes allocating the power storage facilities allocated as the measurement standby facility in a previous allocation of the facility to be measured and the operation facility as the facility to be measured.

10. A power storage system comprising:

the diagnosis apparatus according to claim 9; and the power storage facilities in which the measurement data for diagnosis for each power storage facility is measured by the diagnosis apparatus.

11. A non-transitory storage medium storing a diagnosis program of a power storage system, the power storage system including a plurality of power storage facilities connected to a power grid through a connection switching circuit controlled by a processing circuit, the diagnosis program causing a computer to implement:

allocating by the connection switching circuit controlled by the processing circuit at least one of the plurality of power storage facilities as a facility to be measured and allocating by the connection switching circuit controlled by the processing circuit at least one of the rest of the plurality facilities other than the facility to be measured as an operation facility that exchanges electric power through a power grid;

charging and discharging by the connection switching circuit controlled by the processing circuit each facility as the facility to be measured by exchanging electric power with another power storage facility of the power storage system, and measuring measurement data for diagnosis of each facility as the facility to be measured; and repeating by the connection switching circuit controlled by the processing circuit allocation of the facility to be measured and the operation facility and a measurement of the measurement data for each facility as the facility to be measured by sequentially changing power storage facilities to be allocated as the facility to be measured until the measurement data is measured for all of the power storage facilities, wherein the allocating the facility to be measured and the operation facility includes allocating power storage facilities serving as a measurement standby facility from power storage facilities that are not allocated as the facility to be measured and do not measure the measurement data, the measuring the measurement data for each facility as the facility to be measured includes charging and discharging each facility as the facility to be measured by exchanging the electric power between power storage facilities allocated as the facility to be measured and power storage facilities allocated as the measurement standby facility, and the allocating the facility to be measured and the operation facility includes allocating the power storage facilities allocated as the measurement standby facility in a previous allocation of the facility to be measured and the operation facility as the facility to be measured.

* * * * *